United States Patent
Haramoto

(10) Patent No.: US 8,039,832 B2
(45) Date of Patent: Oct. 18, 2011

(54) LIQUID CRYSTALLINE ORGANIC SEMICONDUCTOR MATERIAL, AND SEMICONDUCTOR ELEMENT OR INFORMATION RECORDING MEDIUM USING THE SAME

(75) Inventor: Yuichiro Haramoto, Yamanashi (JP)

(73) Assignees: Yamanashi University, Kofu-shi, Yamanashi (JP); Nippon Chemical Industrial Co., Ltd., Tokyo (JP)

( * ) Notice: Subject to any disclaimer, the term of this patent is extended or adjusted under 35 U.S.C. 154(b) by 464 days.

(21) Appl. No.: 11/995,630

(22) PCT Filed: Feb. 17, 2006

(86) PCT No.: PCT/JP2006/302794
§ 371 (c)(1),
(2), (4) Date: Mar. 9, 2009

(87) PCT Pub. No.: WO2007/007441
PCT Pub. Date: Jan. 18, 2007

(65) Prior Publication Data
US 2009/0250676 A1 Oct. 8, 2009

(30) Foreign Application Priority Data
Jul. 14, 2005 (JP) ................. 2005-206070

(51) Int. Cl.
*H01L 51/30* (2006.01)
*C09K 19/06* (2006.01)

(52) U.S. Cl. .............. 257/40; 252/299.6

(58) Field of Classification Search ........... 252/299.01, 252/299.4, 299.6; 428/1.1; 430/20; 257/40
See application file for complete search history.

(56) References Cited

U.S. PATENT DOCUMENTS

| | | | |
|---|---|---|---|
| 6,650,387 B1 | 11/2003 | Asao et al. | |
| 6,838,129 B2 * | 1/2005 | Haramoto | 428/1.1 |
| 7,625,499 B2 * | 12/2009 | Haramoto | 252/299.01 |
| 7,742,112 B2 * | 6/2010 | Haramoto et al. | 349/1 |
| 7,965,534 B2 * | 6/2011 | Haramoto et al. | 365/108 |
| 2008/0087867 A1 | 4/2008 | Haramoto | |

FOREIGN PATENT DOCUMENTS

| | | |
|---|---|---|
| CN | 101072846 A | 11/2007 |
| JP | 2000-289000 A | 10/2000 |
| JP | 2001-351786 A | 12/2001 |
| JP | 2004-6271 A | 8/2004 |
| JP | 2004-311182 A | 11/2004 |
| JP | 2005-142233 A | 6/2005 |
| JP | 2006-342318 A | 12/2006 |

OTHER PUBLICATIONS

English translation by computer for JP2004006271, http://www4.ipdl.inpit.go.jp/Tokujitu/PAJdetail.ipdl?N0000=60&N0120=01&N2001=2&N3001=2004-006271.*
Korean Office Action dated Oct. 28, 2009, issued in corresponding Korean Patent Application No. 1020087003511.
International Search Report of PCT/JP2006/302794, date of mailing Mar. 20, 2006.
Chinese Office Action dated Apr. 24, 2009, issued in corresponding Chinese Patent Application No. 2006-800256488.

* cited by examiner

*Primary Examiner* — Shean Wu
(74) *Attorney, Agent, or Firm* — Westerman, Hattori, Daniels & Adrian, LLP

(57) ABSTRACT

An liquid crystalline organic semiconductor material practical as an organic semiconductor is provided. The material is a liquid crystal composition having a smectic liquid crystal phase. The liquid crystalline organic semiconductor material has a distyrylbenzene structure of formula (1). When heated to a temperature range for the smectic liquid crystal phase followed by being cooled, the material takes on a solid state as a result of phase transition from the smectic phase.

[Chemical formula 1]

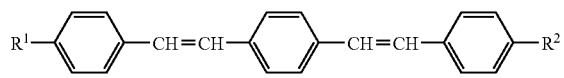

(1)

Wherein $R^1$ and $R^2$, which may be the same or different, each represent an alkyl group, an alkoxy group or a group of general formula (2):

[Chemical formula 2]

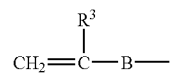

(2)

Wherein $R^3$ represents a hydrogen atom or a methyl group; and B represents —$(CH_2)_m$—, —$(CH_2)_m$—O—, —CO—O—$(CH_2)_m$, —CO—O—$(CH_2)_m$—O—, —$C_6H_4$—$CH_2$—O— or —CO—.

7 Claims, 3 Drawing Sheets

ITO/PEDOT/Liq/Al

LIQUID CRYSTALLINE ORGANIC SEMICONDUCTOR MATERIAL, AND SEMICONDUCTOR ELEMENT OR INFORMATION RECORDING MEDIUM USING THE SAME

TECHNICAL FIELD

This invention relates to a liquid crystalline organic semiconductor material. More particularly, it relates to a liquid crystalline organic semiconductor material comprising a liquid crystal composition exhibiting a smectic phase as a liquid crystal phase and to a semiconductor element or an information recording medium using the same.

BACKGROUND ART

Liquid crystal compounds have widely been used as a display material of TV sets, personal computers, watches, and so forth. Studies in recent years have revealed that those having a smectic liquid crystal phase exhibit charge transport properties, and their applicability as a charge transport material or a luminescent material in organic electroluminescent (EL) devices has been suggested. Liquid crystal compounds are classified into thermotropic and lyotropic liquid crystals according to the phase transition behavior, or classified into three categories: smectic, nematic, and cholesteric according to the molecular alignment.

The inventor of the present invention has previously proposed, as a result of his study, a charge transport method using a liquid crystal compound having a smectic liquid crystal phase as a charge transport material (see Patent Document 1), a liquid crystal compound exhibiting excellent charge transport properties without requiring photoexcitation (see Patent Document 2), and a liquid crystalline organic EL device having high carrier mobility (see Patent Document 3).

Noting that, in his latest work, the molecular alignment of organic EL materials affects electron/hole transport, the inventor proposed an electroconductive liquid crystal material that is obtained by co-depositing two distyrylbenzene compounds different in length of alkyl groups and displays a smectic liquid crystal phase on being heated to develop high charge transport properties (see Non Patent Document 1).
Patent Document 1: JP 2001-351786A
Patent Document 2: JP 2004-6271A
Patent Document 3: JP 2004-311182A
Non Patent Document 1: Japanese Patent Application No. 2004-354744 (Japanese Patent Application No. 2005-140800)

DISCLOSURE OF THE INVENTION

Problem to be Solved by the Invention

However, the above-described electroconductive liquid crystal material has the following problem arising from the rigid distyrylbenzene structure serving for charge transport. That is, it has poor solubility in various solvents like many other low-molecular-weight organic EL materials. Therefore, the organic thin film formation must be carried out by vacuum deposition onto a substrate, which makes it not easy to apply the material to complicated integrated circuits (ICs) and organic semiconductors.

In the light of the above circumstances, the present invention is contemplated to provide a liquid crystalline organic semiconductor material useful as an organic semiconductor and a semiconductor element using the material. The invention is also contemplated to provide an information recording medium using the liquid crystalline organic semiconductor material and a method of recording data on the information recording medium.

Means for Solving the Problem (1) The liquid crystalline organic semiconductor material of the invention is a liquid crystal composition having a smectic liquid crystal phase. The liquid crystalline organic semiconductor material has a distyrylbenzene structure represented by general formula (1) below. The liquid crystalline organic semiconductor material, when heated to a temperature range in which a smectic liquid crystal phase is formed followed by being cooled, takes on a solid state as a result of phase transition from the smectic phase.

[Chemical formula 1]

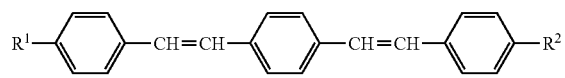

(1)

Wherein $R^1$ and $R^2$, which may be the same or different, each represent an alkyl group, an alkoxy group or a group represented by general formula (2):

[Chemical formula 2]

(2)

Wherein $R^3$ represents a hydrogen atom or a methyl group; and B represents —$(CH_2)_m$—, —$(CH_2)_m$—O—, —CO—O—$(CH_2)_m$, —CO—O—$(CH_2)_m$—O—, —$C_6H_4$—$CH_2$—O— or —CO—.

(2) In an embodiment of the liquid crystalline organic semiconductor material of the invention, at least one of $R^1$ and $R^2$ in general formula (1) is a straight-chain or branched alkyl group having 3 to 18 carbon atoms.

(3) In an embodiment of the liquid crystalline organic semiconductor material of the invention, at least one of $R^1$ and $R^2$ in general formula (1) is a straight-chain alkyl group having 3 to 18 carbon atoms.

(4) In an embodiment of the liquid crystalline organic semiconductor material of the invention, one of $R^1$ and $R^2$ in general formula (1) is a straight-chain or branched alkoxy group, with the other being a straight-chain alkyl group having 3 to 18 carbon atoms.

(5) In an embodiment of the liquid crystalline organic semiconductor material of the invention, one of $R^1$ and $R^2$ in general formula (1) is a group represented by formula (3) below, with the other being a straight-chain alkyl group having 3 to 18 carbon atoms.

[Chemical formula 3]

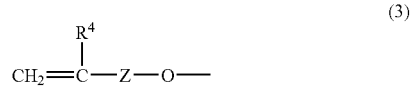

(3)

Wherein $R^4$ represents a hydrogen atom or a methyl group; and Z represents —CO—O—$(CH_2)_n$—, —$C_6H_4$—$CH_2$—, —$CH_2$—, or CO—.

(6) The semiconductor material of the invention comprises a mixture of at least two kinds of the liquid crystalline organic semiconductor material according to any one of claims 1 to 5.

(7) The semiconductor element of the invention is fabricated using the liquid crystalline organic semiconductor material according to any one of claims 1 to 6.

(8) In an embodiment of the semiconductor element of the invention, the semiconductor element is fabricated by dissolving the liquid crystalline organic semiconductor material in a solvent to obtain a solution, applying the solution to a substrate by a coating technique such as printing, dip coating or spin coating to form an organic thin film, and heating the organic thin film to a temperature range in which a smectic liquid crystal phase of the liquid crystalline organic semiconductor material is formed.

(9) The information recording medium of the invention uses the liquid crystalline organic semiconductor material according to any one of claims 1 to 6. The recording medium accomplishes data recording by selectively heating the medium to a temperature range in which the liquid crystalline organic semiconductor material exhibits a smectic liquid crystal phase followed by cooling to make electroconductive portions at the heated and cooled portions and non-electroconductive portions at the non-heated portions thereby to create a difference in electroconductivity or optical anisotropy between the electroconductive portions and non-electroconductive portions.

(10) The information recording medium of the invention uses the liquid crystalline organic semiconductor material according to any one of claims 1 to 6. The recording medium is obtained by dissolving the liquid crystalline organic semiconductor material in a solvent to obtain a solution and applying the solution to a substrate by a coating technique such as printing, dip coating or spin coating to form an organic thin film. The recording medium accomplishes data recording by selectively heating the medium to a temperature range in which the liquid crystalline organic semiconductor material exhibits a smectic liquid crystal phase followed by cooling to make electroconductive portions at the heated and cooled portions and non-electroconductive portions at the non-heated portions thereby to create a difference in electroconductivity or optical anisotropy between the electroconductive portions and non-electroconductive portions.

(11) In an embodiment of the information recording medium of the invention, the heating of the organic thin film is carried out by spot heating with a laser and the like.

Effect of the Invention

The liquid crystalline organic semiconductor material of the invention is electrically insulating with no heat applied but, on being heated to a prescribed temperature range, develops charge transport properties fit for use as an organic semiconductor. The liquid crystalline organic semiconductor material having an alkyl group in the side chain of at least one end of the distyrylbenzene structure shows high solubility in various solvents. This makes it feasible to form an organic thin film of the material on a substrate through convenient techniques including printing and coating. Ease of thin film formation on a substrate is beneficial to fabricate organic semiconductors and organic semiconductor elements with ease and at low cost.

The organic thin film formed on a substrate can be heated selectively to create a difference in electroconductivity or optical anisotropy. Therefore, the liquid crystalline organic semiconductor material of the invention provides an information recording medium capable of recording information as a difference in electroconductivity or optical anisotropy and is applicable to such information recording media as IC tags or various cards and to data recording methods.

Figure 1:
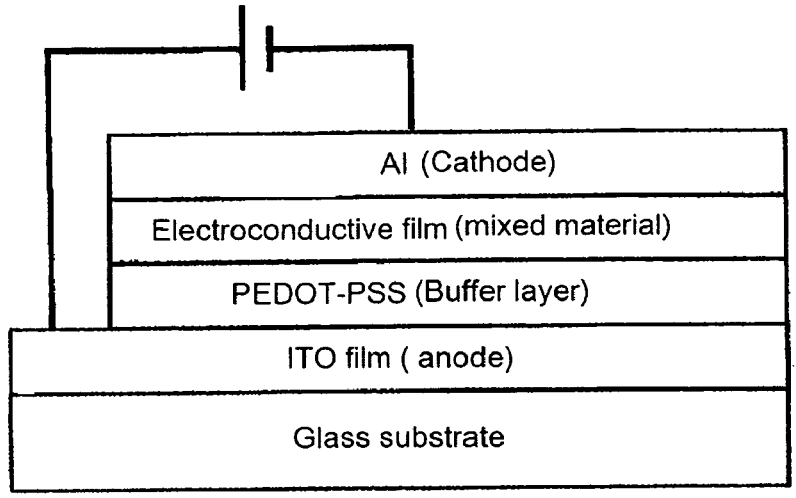
FIG. 1 is a schematic illustration of a semiconductor element of the invention.

EXPLANATION OF SYMBOLS (1) Card substrate
(2) Organic thin film
(3) Electroconductive spots
(4) Non-electroconductive spots
(5) Protective film
(6) Laser light Best Mode for Carrying out the Invention Preferred embodiments of the present invention will be described. The liquid crystalline organic semiconductor material of the present invention is a liquid crystal composition having a smectic phase as a liquid crystal phase. The liquid crystalline organic semiconductor material has a distyrylbenzene structure represented by general formula (1) below and, when heated to a temperature range in which a smectic liquid crystal phase is formed followed by being cooled, characteristically takes on a solid state as a result of phase transition from the smectic phase. The liquid crystalline organic semiconductor material has the following characteristics suited for use as an organic semiconductor. It has little electroconductivity, serving like an insulator, in its intact, non-heated state. In a solid smectic phase state obtained by heating followed by cooling, however, it exhibits high electroconductivity above a threshold voltage of about 4 to 5 V and increases in amount of the current with the voltage applied.

[Chemical formula 4]

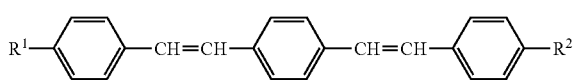

(1)

Wherein $R^1$ and $R^2$, which may be the same or different, each represent an alkyl group, an alkoxy group or a group represented by general formula (2):

[Chemical formula 5]

(2)

Wherein $R^3$ represents a hydrogen atom or a methyl group; and B represents —$(CH_2)_m$—, —$(CH_2)_m$—O—, —CO—O—$(CH_2)_m$—, —CO—O—$(CH_2)_m$—O—, —$C_6H_4$—$CH_2$—O— or —CO—.

As used herein, the term "solid state" means a crystal layer or a glassy amorphous solid formed by heating the liquid crystalline organic semiconductor material at a prescribed temperature to create a smectic liquid crystal state and then cooling the material to a room temperature (5° C. to 40° C.). The temperature range in which the liquid crystalline organic semiconductor material displays a smectic liquid crystal state is preferably 90° C. to 300° C., more preferably 130° C. to 250° C.

The liquid crystalline organic semiconductor material in which at least one of $R^1$ and $R^2$ of general formula (1) is a straight-chain or branched alkyl group having 3 to 18 carbon atoms has high solubility in various solvents as well as high electroconductivity above a threshold voltage of 4 to 5 V.

The term "alkyl group" as used herein denotes an alkyl group having 1 to 18 carbon atoms, including methyl, ethyl, butyl, pentyl, hexyl, octyl, dodecyl, pentadecyl, and octadecyl. An alkyl group having 3 to 18 carbon atoms is more preferred. One having 7 to 18 carbon atoms is even more preferred.

In general formula (2), m in B is preferably 1 to 18, more preferably 6 to 18. The compound of general formula (1) in which at least one of $R^1$ and $R^2$ has an unsaturated bond of the structure represented by the general formula (2) is able to homo- or copolymerize into a polymeric liquid crystalline organic semiconductor material. The copolymer may be a copolymer of two or more compounds represented by general formula (1) different in structures of $R^1$ and $R^2$.

Solvents in which the liquid crystalline organic semiconductor material is dissolved include ethers such as dioxane, tetrahydrofuran, and dibutyl ether; nitriles such as acetonitrile; alcohols such as methanol, ethanol, isopropyl alcohol, and butanol; organic solvents such as toluene, xylene, chloroform, dimethylformamide, and acetone. Also included are solvents used in printing inks of rotary presses and inkjet printers. The solvent may be a single-component solvent or a mixed solvent consisting of two or more solvents.

The liquid crystalline organic semiconductor material represented by general formula (1) is prepared through reaction schemes (1), (2) or (3) shown below.

In reaction schemes (1) through (3), X represents a halogen atom, e.g., chlorine, bromine or iodine. Bromine is particularly preferred for its reactivity.

Reaction scheme (1)

[Chemical formula 6]

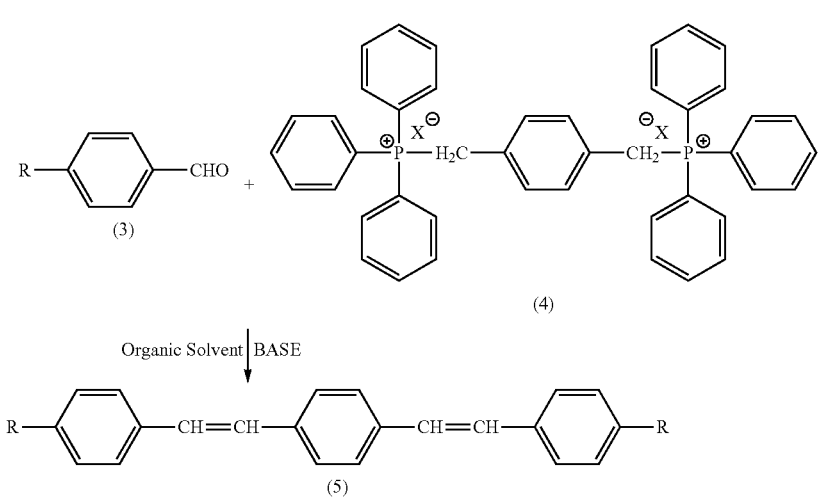

Reaction scheme (1) is to synthesize advantageously the compound of general formula (1) in which $R^1$ and $R^2$ are the same group. Specifically, a benzaldehyde derivative (compound (3)) and 2 to 4 times the molar quantity of a triphenylphosphonium halide compound (compound (4)) are caused to react with each other in the presence of 1 to 5 moles, per mole of the triphenylphosphonium halide compound (compound (4)), of a base (e.g., an alkoxide) in an organic solvent such as an alcohol at 0° C. to 100° C. for 0.5 to 50 hours to obtain the liquid crystalline organic semiconductor material (compound (5)). In reaction scheme (1), R represents $R^1$ or $R^2$ of general formula (1), indicating that $R^1$=$R^2$.

Reaction Scheme (2)

[Chemical formula 7]

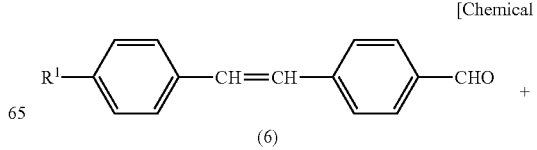

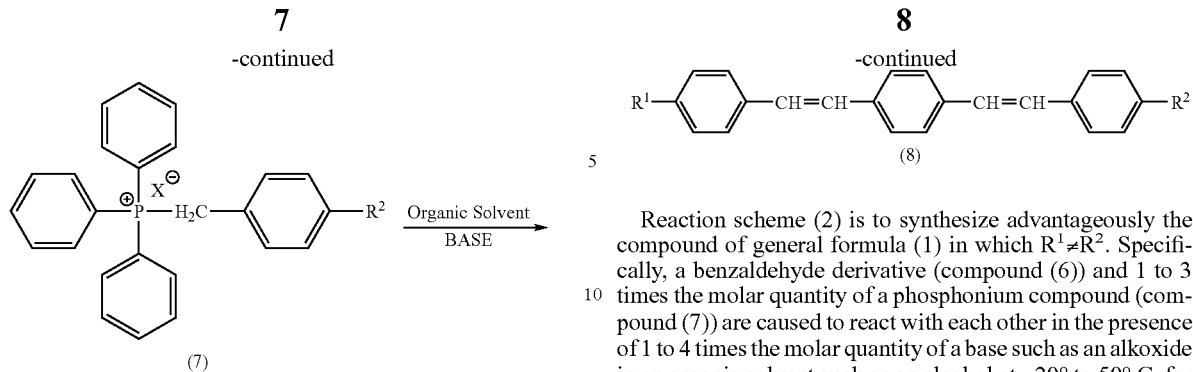

Reaction scheme (2) is to synthesize advantageously the compound of general formula (1) in which $R^1 \neq R^2$. Specifically, a benzaldehyde derivative (compound (6)) and 1 to 3 times the molar quantity of a phosphonium compound (compound (7)) are caused to react with each other in the presence of 1 to 4 times the molar quantity of a base such as an alkoxide in an organic solvent such as an alcohol at −20° to 50° C. for 1 to 50 hours to obtain the liquid crystalline organic semiconductor material (compound (8)).

Reaction scheme (3)

[Chemical formula 8]

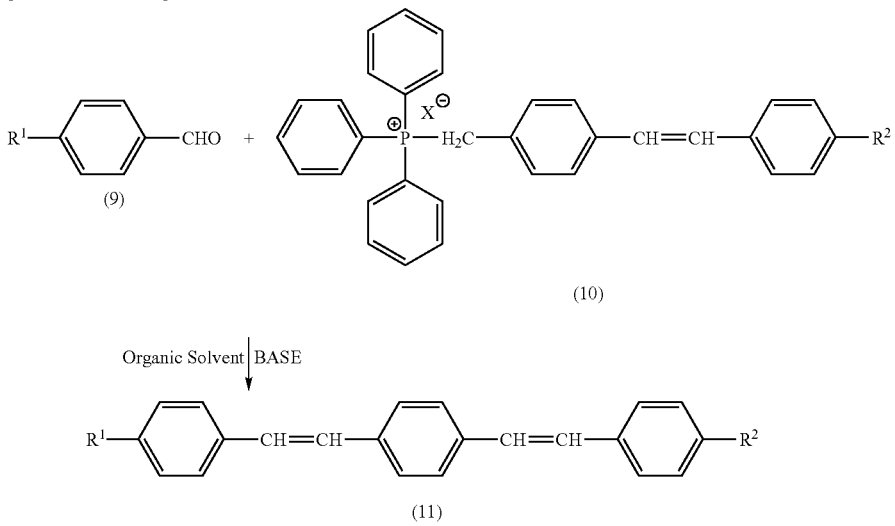

Reaction scheme (3) is to synthesize advantageously the compound of general formula (1) in which $R^1 \neq R^2$ similarly to reaction scheme (2). Specifically, a benzaldehyde derivative (compound (9)) and 1 to 3 times the molar quantity of a phosphonium compound (compound (10)) are caused to react with each other in the presence of 1 to 4 times the molar quantity of a base such as an alkoxide in an organic solvent such as an alcohol at −20° C. to 50° C. for 1 to 50 hours to obtain the liquid crystalline organic semiconductor material (compound (11)).

In general formula (1), it is preferred that one of $R^1$ and $R^2$ is a straight-chain alkyl group as in general formulae (12) and (13) shown below. The alkyl group preferably has 3 to 18 carbon atoms, more preferably 7 to 18 carbon atoms (m=6 to 17).

[Chemical formula 9]

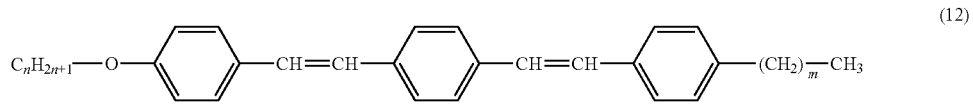

[Chemical formula 10]

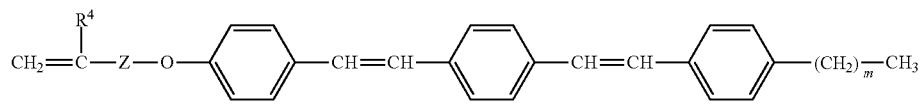

(13)

The alkoxy group in general formula (12) preferably contains 2 to 18 carbon atoms (n=2 to 18). $R^4$ in general formula (13) represents a hydrogen atom or a methyl group, and Z represents —CO—O—$(CH_2)_n$—, —$C_6H_4$—$CH_2$—, —$CH_2$—, or —CO—.

The semiconductor element of the present invention is characterized by being fabricated using the above-recited liquid crystalline organic semiconductor material (1), (5), (8), (11), (12), or (13).

An organic thin film of the liquid crystalline organic semiconductor material (1), (5), (8), (11), (12), or (13) formed on a substrate by, for example, vacuum deposition or coating is heat-treated, whereupon the liquid crystalline organic semiconductor material takes on a smectic liquid crystal alignment in a way that the distyrylbenzene structures functioning for charge transport are closely superposed one on top of another and develop such high electroconductivity as to be able to transport charges at an electric current density of 100 $\mu A/cm^2$ or higher above a threshold voltage of around 4 to 5 V. The smectic molecular alignment is retained after the thin film is cooled to room temperature.

The semiconductor element is preferably fabricated using a mixture containing at least two of the liquid crystalline organic semiconductor materials (1), (5), (8), (11), (12), and (13). The semiconductor element fabricated from such a mixed material shows a higher retention of the smectic molecular orientation after cooling to room temperature, which means higher electroconductivity, than the one fabricated from only one of the liquid crystalline organic semiconductor materials.

It is preferred that the organic thin film is formed on a substrate by coating the substrate with a solution of the soluble liquid crystalline organic semiconductor material (1), (5), (8), (11), (12) or (13) in a solvent by printing, dip coating, spin coating or like coating techniques. The organic thin film thus formed is heated to a temperature range in which the liquid crystalline organic semiconductor material takes on a smectic liquid crystal phase to provide an electroconductive film. In this case, large scale equipment for thin film formation as has been used conventionally is no more necessary, and complicated ICs and organic semiconductors can be produced easily and economically by simple use of, for example, general-purpose printing equipment.

Examples of the solvent to be used in the thin film formation include organic solvents such as ethers, nitrites, alcohols, toluene, xylene, chloroform, dimethylformamide, and acetone, as well as various solvents usable in printing inks. These solvents may be used either individually or as a mixture of two or more thereof.

The information recording medium of the present invention uses the liquid crystalline organic semiconductor material (1), (5), (8), (11), (12) or (13). The recording medium achieves data recording by creating a difference in electroconductivity or optical anisotropy between an electroconductive portion and a non-electroconductive portion. The electroconductive portion is formed by heating the liquid crystalline organic semiconductor material (1), (5), (8), (11), (12) or (13) to a temperature range in which a smectic liquid crystal phase is formed, followed by cooling. The non-electroconductive portion is a portion not having been heated.

The liquid crystalline organic semiconductor material (1), (5), (8), (11), (12) or (13) has such electric characteristics that it develops high electroconductivity in its smectic liquid crystal state but remains nearly insulating (amorphous) as long as it is not heated and also has such optical characteristics that it exhibits higher light transmission or reflection in its smectic liquid crystal state than in its amorphous state. These characteristics can be taken advantage of to achieve data recording. For example, the electroconductive portions having a smectic liquid crystal phase are taken to represent digit [1], with the amorphous, non-electroconductive portions are taken to represent digit [0], and data are recorded by making use of the difference in electroconductivity or optical anisotropy between the electroconductive portions [1] and the non-electroconductive portions [0] of the organic thin film.

The data recorded on the recording medium are readable with either a reader that reads difference in electroconductivity or a reader that reads difference in optical anisotropy. Therefore, the information recording medium of the invention functions with both contact and contactless readers. The thin film may also be formed by deposition such as vacuum deposition or by coating such as printing, as hereinafter described.

The information recording medium of the invention is preferably obtained by dissolving the liquid crystalline organic semiconductor material (1) (5) (8) (11) (12) or (13) in a solvent to obtain a solution, applying the solution to a substrate by a coating technique such as printing, dip coating or spin coating to form an organic thin film on the substrate. In carrying out data recording, the organic thin film is selectively heated to a temperature range in which a smectic liquid crystal phase is formed, followed by cooling to form the electroconductive portions and the non-electroconductive portions not having been heated to create a difference in electroconductivity or optical anisotropy between the electroconductive portions and the non-electroconductive portions. In this case, the organic thin film can be formed on the substrate easily and conveniently without needing large scale equipment. This contributes to cost reduction in the manufacture of information recording media such as cards and IC tags.

Examples of suitable printing methods include, but are not limited to, screen printing and inkjet printing.

The heat treatment can be carried out using a spot heating means that heats a small area, such as a laser, to record a large volume of data on extremely small chips or tags.

The present invention will now be illustrated in greater detail by way of Examples, but it should be understood that the invention is not construed as being limited thereto.

EXAMPLE 1

A liquid crystalline organic semiconductor material having the same C15 alkoxy group at both ends of the distyrylbenzene structure (compound (13)) was synthesized in accordance with reaction scheme (4).

Reaction scheme 4:

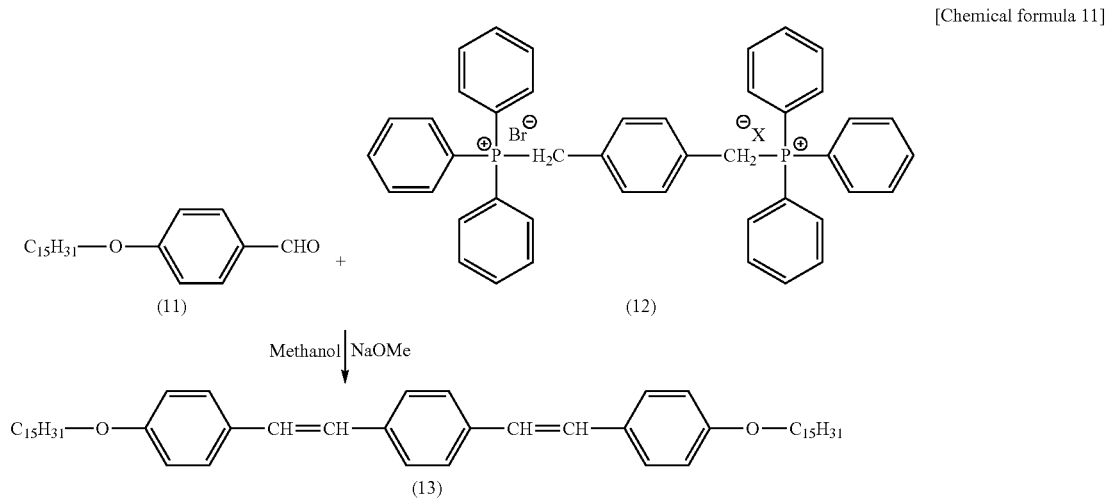

In 100 ml of methanol were suspended 7.87 g (0.0237 mol) of a benzaldehyde derivative (compound (11)) and 8.65 g (0.011 mol) of p-xylenebistriphenylphosphonium bromide compound (compound (12)), and 6.87 g (0.0356 mol) of 28 wt % sodium methylate was added thereto dropwise at room temperature (25° C.), followed by aging at a dry bulb temperature of 65° C. for 3 hours. After completion of the reaction, methanol was removed, 200 ml of water added, the mixture stirred, and the precipitate collected by filtration. The product was washed and dried to give 0.19 g of compound (13).

Identification Data of Compound (13):
$^1$H-NMR: δ ppm (#H, splitting)
7.45 ppm (4H, s), 7.42 ppm (4H, d), 7.06 ppm (2H, d), 6.94 ppm (2H, d), 6.88 ppm (4H, t), 3.96 ppm (4H, t), 1.78 ppm (4H, m), 1.2-1.5 ppm (48H, m), 0.87 ppm (6H, t).

A liquid crystalline organic semiconductor material (compound (14)) having the same $C_{10}$ alkoxy group at both ends was obtained in the same condition and process of reaction as described above, except for changing the benzaldehyde derivative (compound (11)) in reaction scheme (4) from p-pentadecaneoxybenzaldehyde to p-bromodecaneoxybenzaldehyde.

Identification Data of Compound (14):
$^1$H-NMR: δ ppm (#H, splitting)
7.45 ppm (4H, s), 7.43 ppm (4H, d), 7.06 (ppm (2H, d), 6.94 ppm (2H, d), 6.87 ppm (4H, t), 3.98 ppm (4H, t), 1.77 ppm (4H, m), 1.2-1.5 ppm (28H, m), 0.88 ppm (6H, t).

[Chemical formula 12]

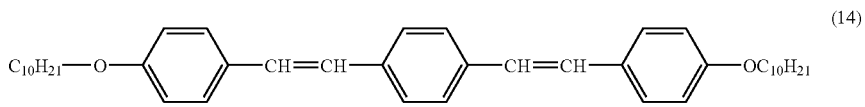

(14)

The resulting liquid crystalline organic semiconductor materials (compounds (13) and (14)) were examined under a polarizing microscope to observe the liquid crystal phase textures. As a result, the compounds were found to display phase transitions as shown in Table 1 below, wherein Cr: crystals, Sm1: smectic G phase; Sm2: smectic F phase; Sm3: smectic C phase; N: nematic phase; I: isotropic liquid.

TABLE 1

| Compound (13) | Cr | ⟷ 138° C. | Sm1 | ⟷ 170° C. | Sm2 | ⟷ 226° C. | Sm3 | ⟷ 308° C. | N | ⟷ 310° C. | I |
|---|---|---|---|---|---|---|---|---|---|---|---|
| Compound (14) | Cr | ⟷ 98° C. | Sm1 | ⟷ 187° C. | Sm2 | ⟷ 250° C. | Sm3 | ⟷ 255° C. | N | ⟷ 270° C. | I |

EXAMPLE 2

An organic thin film was formed on a substrate using a mixture of the two liquid crystalline organic semiconductor materials (compounds (13) and (14)) prepared in Example 1 and examined for its characteristics.

The liquid crystalline organic semiconductor material, which is an equimolar mixture of the compounds (13) and (14), was deposited by vacuum evaporation at room temperature onto a glass substrate (2 mm×2 mm, 0.7 mm t) to form an organic thin film. The organic thin film was heated at 150° C. for 3 minutes to cause the mixed liquid crystalline organic semiconductor material to exhibit a smectic liquid crystal phase and allowed to cool to room temperature to provide an electroconductive film with high electroconductivity.

The resulting electroconductive film was examined for light transmission using a polarizing microscope. As a result, light transmitted through the film had a higher intensity than that through electroconductive films similarly formed using the compound (13) or (14) individually. It has now proved that the electroconductive film formed of the mixed material retains the smectic molecular orientation after cooling to room temperature at a higher probability than the films formed of a single material.

The electroconductive film formed of the mixed material (mixture of compounds (13) and (14)) was examined under a polarizing microscope to observe the liquid crystal phase textures. As a result, the film was found to show the phase transitions according to the following phase transition scheme (1), wherein Cr: crystals; Sm1: smectic G phase; Sm2: smectic F phase; Sm3: smectic C phase; N: nematic; I: isotropic liquid.

Phase transition scheme (1)

[Chemical formula 13]

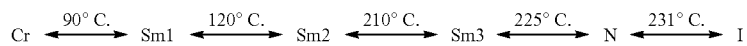

As illustrated in FIG. 1, a 160 nm thick ITO film (anode) was then formed by sputtering on a glass substrate (2 mm×2 mm, 0.7 mm t). Poly(3,4-ethylenedioxythiophene)-polystyrene sulfonate (PEDOT-PSS) layer as a buffer layer was applied to the ITO film by spin coating to form a buffer layer. An equimolar mixture of compounds (13) and (14) was then deposed on the buffer layer by vacuum evaporation to form an organic thin film having a thickness of 300 nm.

The whole organic thin film was then heat treated at 200° C. for 3 minutes to cause the mixed liquid crystalline organic semiconductor material to exhibit a smectic liquid crystal phase and then allowed to cool to cause the liquid crystalline organic semiconductor material to take a solid state, thereby to form an electroconductive film having high electroconductivity. Aluminum was vacuum deposited on the electroconductive film as a cathode to make a semiconductor element having a general structure shown in FIG. 1.

Figure 2:
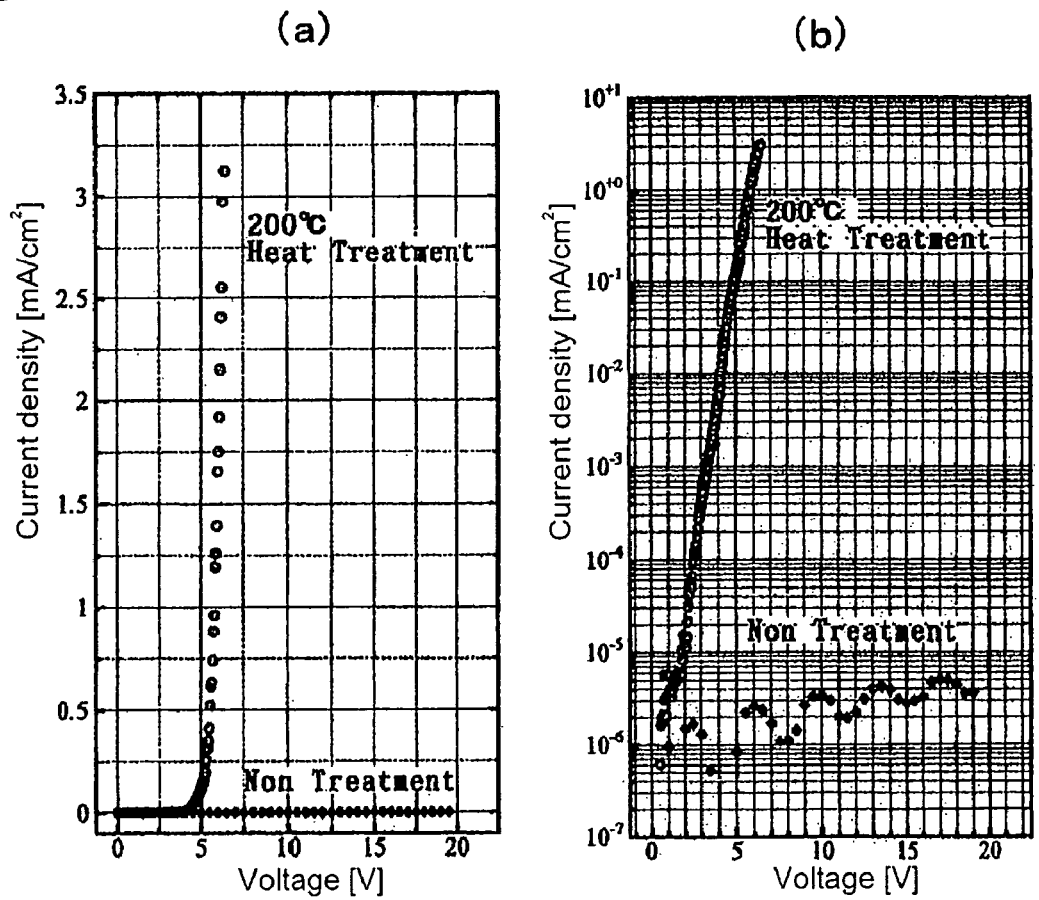
FIG. 2 represents graphs showing electric current density vs. voltage applied to an electroconductive film formed of the liquid crystalline organic semiconductor material of the invention.

A varying voltage was applied to the resulting semiconductor element (designated "Heat Treatment") at room temperature (25° C.), and the current was measured with the increasing voltage. The plots of current vs. voltage are shown in FIGS. 2 (a) and 2 (b).

Separately, a semiconductor element (designated "Non Treatment") was made in the same manner as the "Heat Treatment" semiconductor element, except that the organic thin film was not subjected to the heat treatment (200° C.×3 mins), and tested in the same manner as described. The results obtained are also plotted in the graphs of FIG. 2.

These results have revealed the following. The semiconductor element of the invention, "Heat Treatment", steeply increases the current above a threshold voltage of around 5 V in a room temperature range (25° C.) as can be seen from FIG. 2 (a) and changes its resistivity with a varying applied voltage while increasing the current as can be seen from FIG. 2 (b). In contrast, the semiconductor element "Non Treatment" that has not been subjected to the heat treatment remains substantially insulating irrespective of the voltage applied as can be seen from FIGS. 2 (a) and 2 (b).

Comparison of electroconductivity between the "Heat Treatment" and the "Non Treatment" semiconductor elements revealed differences as large as from $10^5$ to $10^6$ times or even more.

EXAMPLE 3

A liquid crystalline organic semiconductor material having a straight-chain $C_8$ alkyl group at one end and a $C_{12}$ alkoxy group at the other end of the distyrylbenzene structure (compound (17)) was synthesized in accordance with reaction scheme (4).

Reaction scheme (4)

[Chemical formula 14]

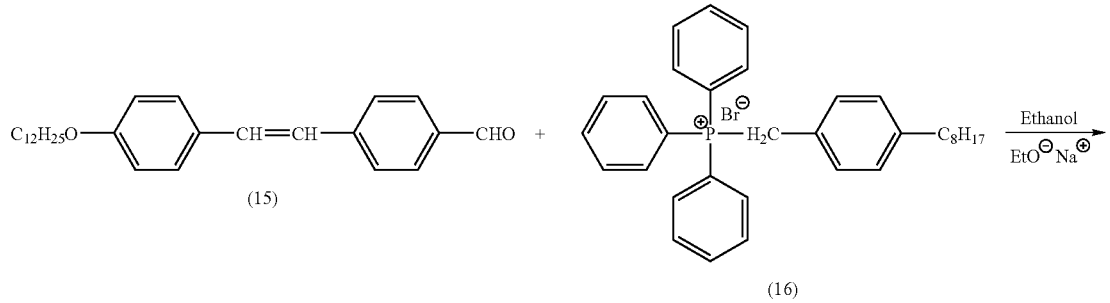

-continued

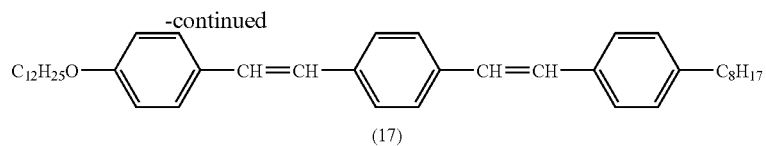

(17)

In ethanol were dissolved 0.471 g (0.0012 mol) of a benzaldehyde derivative (compound (15)) and 0.63 g (0.012 mol) of triphenylphosphonium bromide compound (compound (16), and sodium ethoxide prepared by dissolved 0.5 g of sodium (solid) in ethanol was added thereto dropwise, followed by stirring at 50° C. for 24 hours in a nitrogen atmosphere. After completion of the reaction, the reaction mixture was filtered, and the product was washed and dried to give 0.19 g of compound (17) as a yellow solid.

Identification data of compound 17:
$^1$H-NMR (CDCl$_3$): δ ppm (#H, splitting)
6.9-7.8 ppm (16H, m), 3.9 ppm (2H, t), 2.5-2.6 ppm (2H, t), 1.3-1.9 ppm (32H, m), 0.8-0.9 ppm (6H, m).
IR (KBr): cm$^{-1}$ (assignment)
838 (C—H out-of-plane bend), 1024 (C—O—C symmetric stretch), 1253 (C—O—C antisymmetric stretch), 1560, 1604 (C=C ring stretch), 2850-2956 (aliphatic C—H stretch), 3019 (aromatic C—H stretch)
Mass Spectrum: 578 (M$^+$)

The compound (17) was examined under a polarizing microscope to observe the liquid crystal phase textures. As a result, the compound was found to show the phase transitions according to the following phase transition scheme (2), wherein Cr: crystals; Sm1: smectic G phase; Sm2: smectic F phase; N: nematic; I: isotropic liquid.

Phase Transition Scheme (2)

[Chemical formula 15]

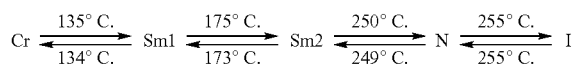

EXAMPLE 4

A liquid crystalline organic semiconductor material having a straight-chain C$_7$ alkyl group at one end and a C$_{10}$ unsaturated group at the other end of the distyrylbenzene structure (compound (20)) was synthesized in accordance with reaction scheme (5).

Reaction scheme (5)

[Chemical formula 16]

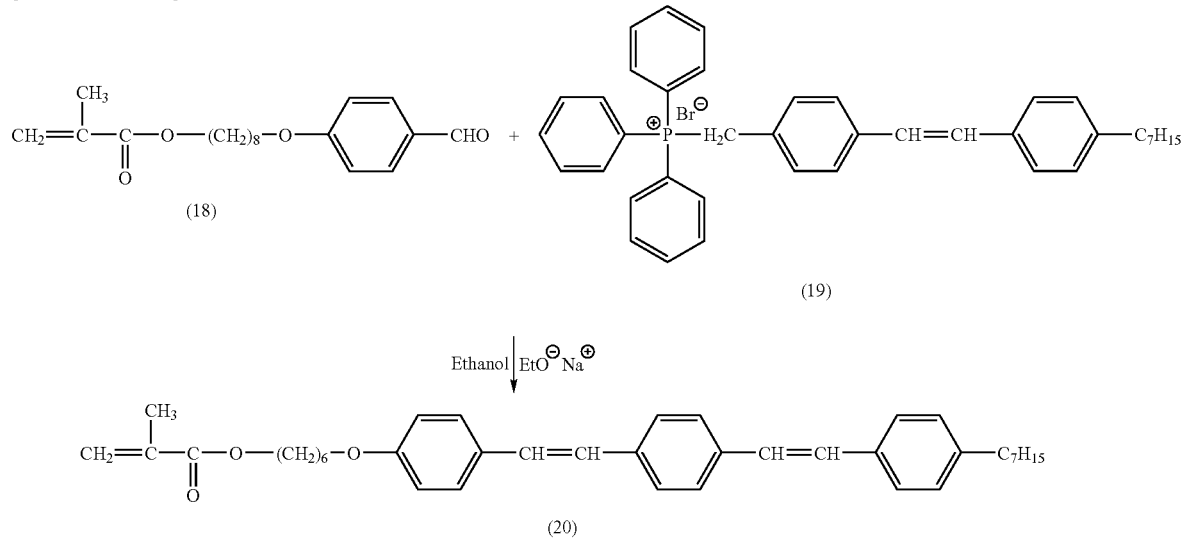

In ethanol were dissolved 0.29 g (0.001 mol) of a benzaldehyde derivative (compound (18)) and 0.63 g (0.001 mol) of triphenylphosphonium bromide compound (compound (19), and sodium ethoxide prepared by dissolved 0.5 g of sodium (solid) in ethanol was added thereto dropwise, followed by stirring at 50° C. for 24 hours in a nitrogen atmosphere. After completion of the reaction, the reaction mixture was filtered, and the product was washed and dried to yield 0.26 g of compound (20) as a yellow solid.

Identification data of compound (20):
$^1$H-NMR (CDCl$_3$): δ ppm (#H, splitting)
6.9-7.8 ppm (16H, m), 5.7-6.2 ppm (2H, m), 4.0-4.2 ppm (4H, m), 2.4-2.5 ppm (2H, t), 1.2-1.9 ppm (18H, m), 0.8-1.0 ppm (6H, m).
IR (KBr): cm$^{-1}$ (assignment)
835 (C—H out-of-plane bend), 1016 (C—O—C symmetric stretch), 1251 (C—O—C antisymmetric stretch), 1515, 1604 (C=C ring stretch), 2852-2923 (aliphatic C—H stretch), 3021 (aromatic C—H stretch)

The compound (20) was examined under a polarizing microscope to observe the liquid crystal phase textures. As a result, the compound was found to show the phase transitions according to the following phase transition scheme (3), wherein Cr: crystals; Sm1: smectic G phase; Sm2: smectic F phase; I: isotropic liquid.

Phase transition scheme (3)

[Chemical formula 17]

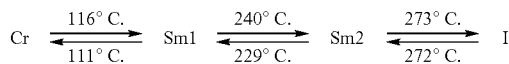

EXAMPLE 5

The liquid crystalline organic semiconductor materials (compounds (17) and (20)) synthesized through reaction schemes (4) and (5), respectively, were evaluated for their characteristics in terms of liquid crystal properties, charge transport properties (electroconductivity), and solubility.
1. Evaluation for Liquid Crystal Properties The liquid crystal textures of the liquid crystalline organic semiconductor materials (compounds (17) and (20)) were observed under a polarizing microscope. It was confirmed that these liquid crystalline organic semiconductor materials both take on smectic molecular alignment as a liquid crystal phase as described in phase transition schemes (2) and (3) above.
2. Evaluation for Charge Transport Properties (Electroconductivity)

Each of the liquid crystalline organic semiconductor materials (compounds (17) and (20)) was sealed into the space between a pair of glass substrates facing each other, each having an ITO electrode to make a liquid crystal cell (ITO electrodes: 4 mm×4 mm, each; cell thickness: 15 μm). A voltage of 5 V was applied to the cell, and the current was measured.

Consequently, the currents measured were as high as 134 μA/cm² with compound (17) and 147 μA/cm² with compound (20). These current densities place the compounds in the category of semiconductors. That is, the electroconductivity of these compounds is sufficient for them to be applied to practical use as organic semiconductors.

It is believed, while not experimented, that compounds (17) and (20) in their smectic phase as obtained by heating followed by cooling exhibit high electroconductivity above a threshold voltage of about 5 V similarly to compounds (13) and (14) in view of their structural commonality of the distyrylbenzene skeleton serving for charge transport function.
3. Solvent Solubility Ten milligrams of each of the liquid crystalline organic semiconductor materials (compounds (17) and (20)) were put in 10 ml of chloroform and stirred at 40° C. for 20 minutes, followed by filtration to remove any insoluble matter. The filtrate was measured for fluorescence intensity at 429 nm. Actually, fluorescence intensity measurement was taken on a 50 μl portion of the filtrate diluted to 10 ml.

Consequently, the fluorescence intensity of the solution of compound (17) (4-fold dilution) was 25,388, which is 455 times the fluorescence intensity (55.77) of a compound having the same alkoxy group ($—O—C_{12}H_{25}$) at both ends of a distyrylbenzene structure. Compound (20), which has a straight-chain alkyl group at one end of the distyrylbenzene structure similarly to compound (17), was also found to have a fluorescent intensity as high as 18,838 (two-fold dilution).

Thus, placing an alkyl group at least one end of the distyrylbenzene structure proves to bring about marked improvement on solvent solubility.

From all the above results are derived the following conclusions. The liquid crystalline organic semiconductor materials (compounds (17) and (20)) have not only high charge transport properties (electroconductivity) sufficient for practical use as organic semiconductors but also high solubility in various solvents. This provides an advantage that they are easily applied to a substrate in the form of a solution in a solvent or printing ink by printing, dip coating, spin coating or a like coating technique to conveniently form an organic thin film. By heating the organic thin film to a temperature range in which the liquid crystalline organic semiconductor material turns to a smectic liquid crystal phase, the compounds (17) and (20) develop high electroconductivity beyond a threshold voltage around 5 V similarly to the compounds (13) and (14), which makes the compounds superior as organic semiconductor materials.

EXAMPLE 6

Figure 3:
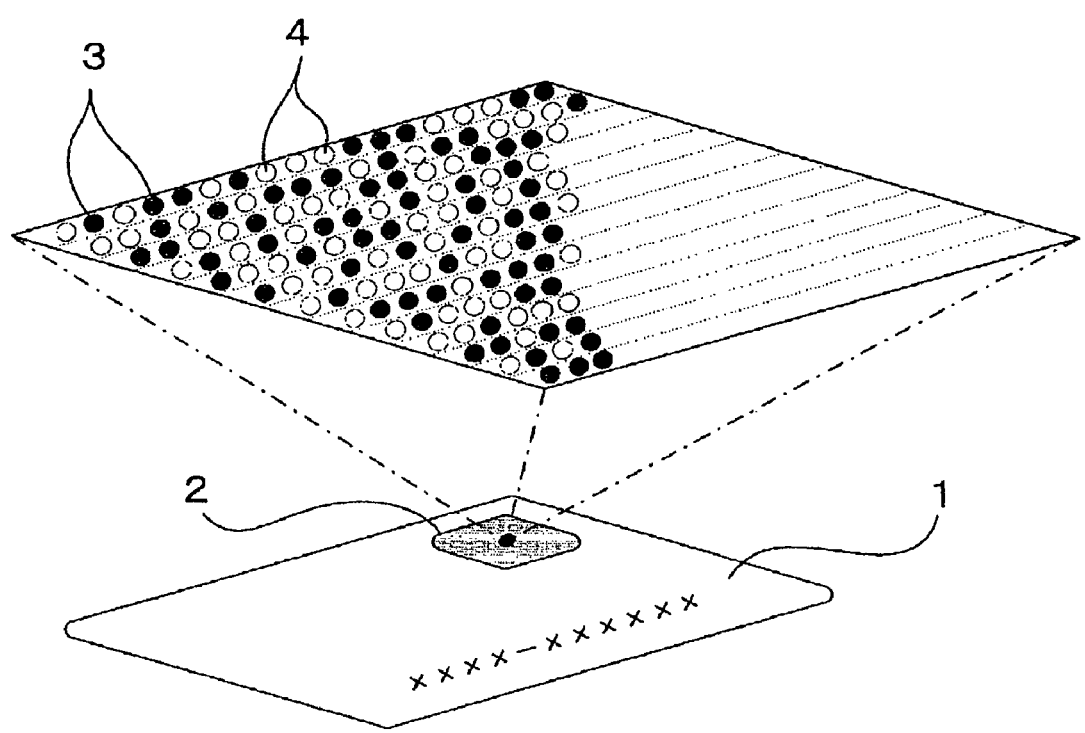
FIG. 3 schematically illustrates the information recording medium of Example 4.

FIG. 3 illustrates an example of the liquid crystalline organic semiconductor material applied to an IC chip (information recording medium) built into a card.

Figure 4:
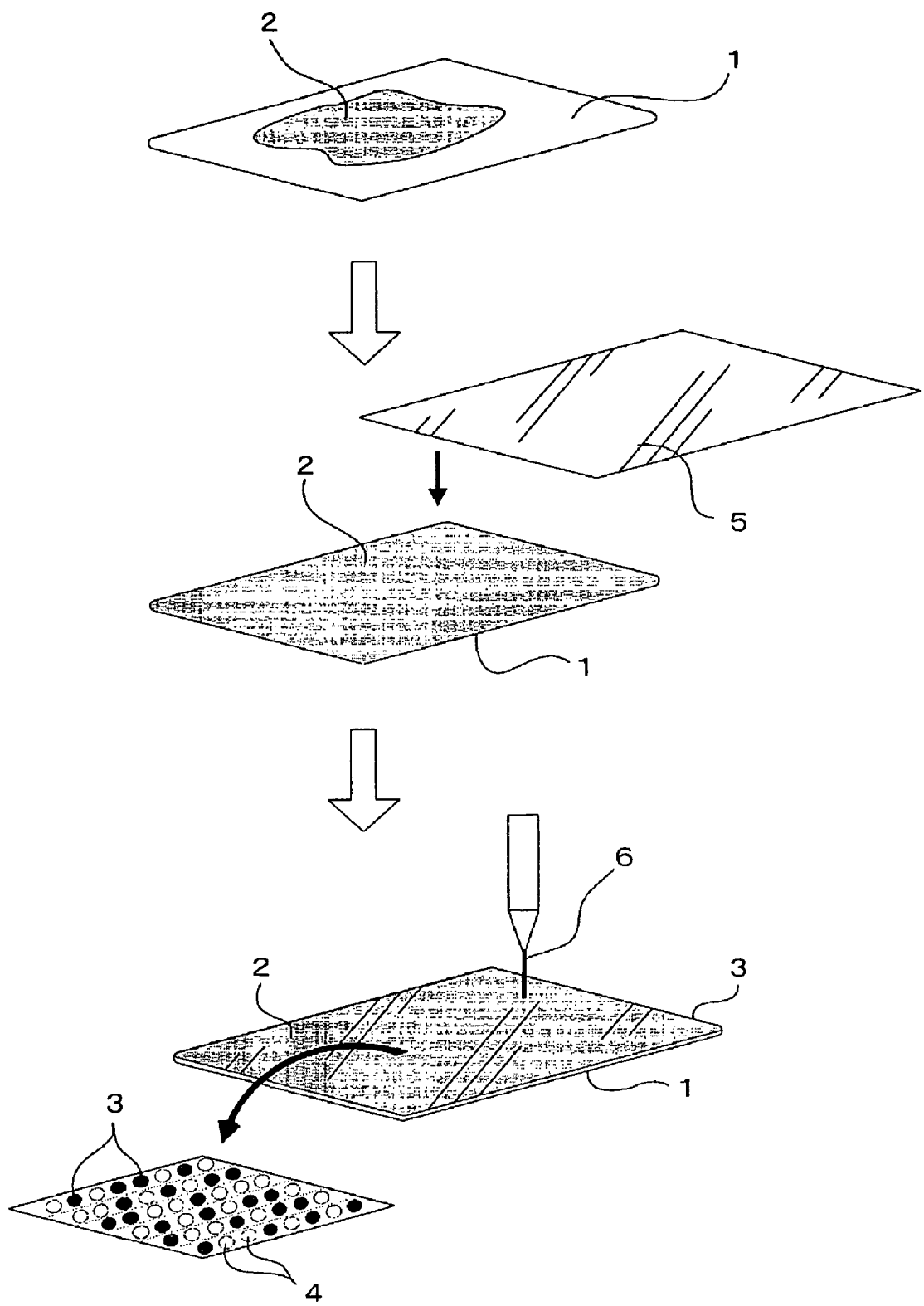
FIG. 4 is a diagram illustrating a method of making an information recording medium.

As illustrated in FIG. 4, the liquid crystalline organic semiconductor material of the invention is applied by spin coating to a part of a substrate 1 of a card, such as a cash card, or an IC tag to form an organic thin film 2. The organic thin film 2 was laminated on the upper side with a protective film 5 for protection of the thin film 2. The organic thin film 2 was selectively heated in spots according to information data to be recorded with a laser beam 6 through the protective film 5 to form electroconductive spots 3 in a smectic state with high electroconductivity and non-electroconductive spots 4 in an amorphous state.

Thus, as shown in FIG. 4, the organic thin film 2 is recorded with binary data consisting of a series of 2 digits: [1] represented by the electroconductive spots 3 having high electroconductivity/high optical anisotropy and [0] represented by the non-electroconductive spots 4 having low electroconductivity/low optical anisotropy. While not shown, a transparent electrode was provided on the lower and upper sides of the individual spots 3 and 4.

The data recorded on the organic thin film 2 as either [0] or [1] can be read with not only a contact reader that recognizes a difference in electroconductivity but a contactless reader that recognizes a difference in optical anisotropy.

The smectic liquid crystal state of the liquid crystalline organic semiconductor material of the present invention is reversible. It is possible to cause the liquid crystalline organic semiconductor material showing a smectic liquid crystal state to take on an amorphous state (insulating state) with low electroconductivity/low optical anisotropy by giving vibrations (e.g., ultrasonication) when cooled from the liquid crystal state.

The liquid crystalline organic semiconductor material of the present invention provides an innovative information recording medium that can be read out by detecting either electroconductivity or optical anisotropy and is also rewritable. The information recording medium is widely applicable as various types of recording media including cards and IC tags.

The invention claimed is:
1. A liquid crystalline organic semiconductor material which is a liquid crystal composition having a smectic liquid crystal phase, has a distyrylbenzene structure represented by general formula (1) below, and, when heated to a temperature range in which a smectic liquid crystal phase is formed fol- lowed by being cooled, takes on a solid state as a result of phase transition from the smectic phase,

 (1)

wherein $R^1$ represents a straight-chain alkyl group having 3 to 18 carbon atoms: and $R^2$ represents an alkoxy group having 2 to 18 carbon atoms, or a group represented by general formula (2):

 (2)

wherein $R^3$ represents a hydrogen atom or a methyl group; and B represents —$(CH_2)_m$—, —$(CH_2)_m$—O—, —CO—O—$(CH_2)_m$, —CO—O—$(CH_2)_m$—O—, —$C_6H_4$—$CH_2$—O— or —CO—; wherein m is 1 to 18.

2. A liquid crystalline organic semiconductor material comprising a mixture of at least two kinds of the liquid crystalline organic semiconductor material according to claim 1.

3. A semiconductor element fabricated using the liquid crystalline organic semiconductor material according to claim 1.

4. The semiconductor element according to claim 3, which is fabricated by dissolving the liquid crystalline organic semiconductor material in a solvent to obtain a solution, applying the solution to a substrate by a coating technique selected from printing, dip coating or spin coating to form an organic thin film, and heating the organic thin film to a temperature range in which a smectic liquid crystal phase of the liquid crystalline organic semiconductor material is formed.

5. An information recording medium comprising the liquid crystalline organic semiconductor material according to claim 1, which is adapted to be heated selectively to a temperature range in which the liquid crystalline organic semiconductor material exhibits a smectic liquid crystal phase and then be cooled to provide an electroconductive portion at a heated and cooled portion and a non-electroconductive portion at a non-heated portion to record data as a difference in electroconductivity or optical anisotropy between the electroconductive portion and the non-electroconductive portion.

6. An information recording medium comprising an organic thin film formed of the liquid crystalline organic semiconductor material according to claim 1 by dissolving the liquid crystalline organic semiconductor material in a solvent to obtain a solution and applying the solution to a substrate by a coating technique such as printing, dip coating or spin coating, the information recording medium being adapted to be heated selectively to a temperature range in which the liquid crystalline organic semiconductor material exhibits a smectic liquid crystal phase and then be cooled to provide an electroconductive portion at a heated and cooled portion and a non-electroconductive portion at a non-heated portion to record data as a difference in electroconductivity or optical anisotropy between the electroconductive portion and the non-electroconductive portion.

7. The information recording medium according to claim 6, wherein a spot heating means a laser used to heat the organic thin film.

\* \* \* \* \*